（12）United States Patent
May et al.

(10) Patent No.: US 8,184,488 B2
(45) Date of Patent: May 22, 2012

(54) SYSTEMS AND METHODS FOR CONTROLLING INTEGRATED CIRCUIT OPERATION WITH BELOW GROUND PIN VOLTAGE

(75) Inventors: Mike R. May, Austin, TX (US); Russell Croman, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 291 days.

(21) Appl. No.: 12/592,240

(22) Filed: Nov. 20, 2009

(65) Prior Publication Data

US 2011/0122671 A1      May 26, 2011

(51) Int. Cl.
*G11C 16/04* (2006.01)
(52) U.S. Cl. .............. 365/189.09; 365/207; 365/189.07; 365/189.11

(58) Field of Classification Search .................. 365/207, 365/94, 189.16, 189.05, 189.06, 189.09, 365/189.11; 327/518, 538–540
See application file for complete search history.

(56) References Cited

U.S. PATENT DOCUMENTS 6,873,559 B2 *   3/2005  Ueda ............................. 365/205
7,961,531 B2 *   6/2011  Han et al. ................. 365/189.09

* cited by examiner

*Primary Examiner* — David Lam
(74) *Attorney, Agent, or Firm* — O'Keefe, Egan, Peterman & Enders LLP

(57) ABSTRACT

Systems and methods for controlling operation of an integrated circuit by applying below ground voltage to one or more pins of the integrated circuit, and in which the application of a below ground pin voltage may be employed as an initiator of (or condition for) a given mode of circuit operation in a manner that prevents the inadvertent initiation of the given mode of operation that may otherwise occur due to accidental application of an above ground voltage to one or more pins of the integrated circuit.

20 Claims, 6 Drawing Sheets

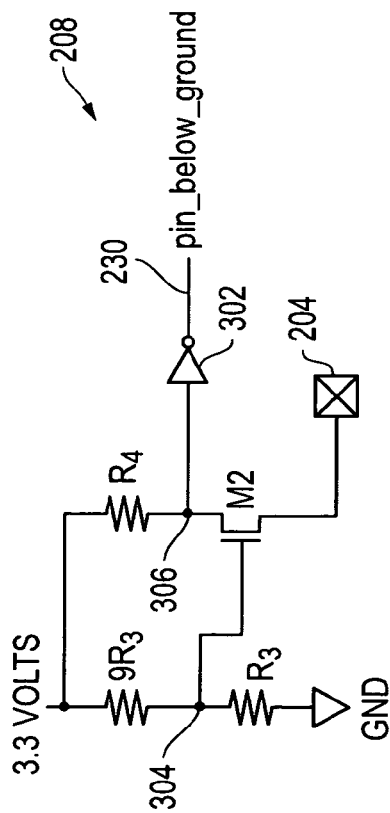
FIG. 4
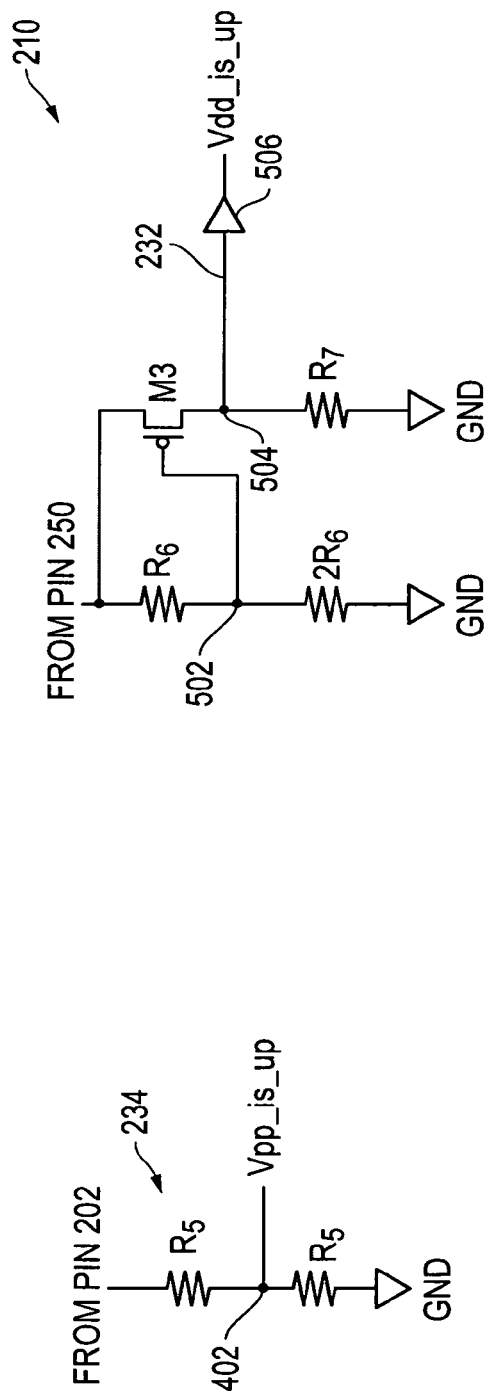
FIG. 6
FIG. 5

SYSTEMS AND METHODS FOR CONTROLLING INTEGRATED CIRCUIT OPERATION WITH BELOW GROUND PIN VOLTAGE

FIELD OF THE INVENTION

This invention relates generally to integrated circuit, and more particularly to control of integrated circuit operation using below ground pin voltage.

BACKGROUND OF THE INVENTION

Non-volatile memory (NVM) in the form of one time programmable (OTP) memory devices are employed for purposes of programming of a general purpose circuit with custom software and settings for a dedicated purpose. A general purpose circuit with an unprogrammed NVM device is typically configured by NVM programming for use in a given type of electronic component (e.g., television tuner, cell phone, etc.), The NVM on the device is programmed with software and settings that are appropriate for the end use application of the given electronic component. However, it is possible for the NVM device of a general purpose circuit to be programmed by accidental application of voltage to the NVM device, which may render the general purpose circuit useless for a specific dedicated purpose when the accidental programming of the NVM device results in permanent reconfiguration of the integrated circuit. Such an accidental programming event may occur during production testing of a general purpose circuit or even after its assembly into an electronic component or one of its subassemblies. In either case, it may be impossible to correct the programming error, and the general purpose circuit may be rendered useless. In the event a general purpose circuit is accidentally programmed after installation into a given type of electronic component or one of its subassemblies, the electronic component or subassembly may need to be destroyed or recycled. Hot insertion of a part or power up without a valid reset are two examples of conditions during which accidental programming of a NVM device may occur.

FIG. 1 shows conventional programmable NVM circuitry 100 of a general purpose integrated circuit that includes a NVM device 102 coupled to receive programming voltage (Vpp) from an external pin 108 via a NVM programming switch M1 (e.g., MOSFET device such as P-FET) that is controlled by processing circuitry 104 (e.g., microprocessor, CPU, etc.). Power supply pin 130 is present to provide supply voltage (e.g., 3.3 volts) via conductive path 132 to circuitry components of the general purpose integrated circuit during normal operating conditions. Processing circuitry 104 is also coupled as shown to exchange data with NVM device 102 and with external digital I/O pin 110. To program NVM device 102, NVM programming data 112 is supplied to processing circuitry 104 via digital I/O pin 110, and a programming voltage Vpp (e.g., 5 volts) that is applied to pin 108. Software and/or hardware of processing circuitry 104 responds to enable NVM programming by providing NVM programming data 114 to NVM device 102 and by supplying a programming enable signal 116 to gate NVM programming switch M1 so that the programming voltage (Vpp) is applied to NVM device 102 by conductive path 118 simultaneously with the NVM programming data 114. Upon application of programming voltage Vpp, programming data 114 is written into NVM device 102.

The programming voltage Vpp is an elevated voltage level that is applied for a relatively short period of time to pin 108 only for intended programming of NVM device 102. Even though the normal supply voltage (e.g., 3.3 volts) is less than the required programming voltage (e.g., 5 volts) for the NVM device 102, it may nonetheless cause unintended programming of NVM device 102 over a longer period of time if it is present at pin 108 and NVM programming switch M1 fails to isolate gate NVM device 102 from pin 108. Further, even voltages that are lower than the normal supply voltage (such as voltages greater than about 1.4 volts) may cause unintended programming of NVM device 102.

SUMMARY OF THE INVENTION

Disclosed herein are systems and methods for controlling operation (e.g., operating mode) of an integrated circuit by applying below ground voltage to one or more pins of the integrated circuit. In digital or analog circuit implementations where applied pin voltages are otherwise always above ground, application of a below ground pin voltage may be advantageously employed as an initiator of (or condition for) a given mode of circuit operation in a manner that prevents the inadvertent initiation of the given mode of operation that may otherwise occur due to accidental application of an above ground voltage to one or more pins of the integrated circuit. Although any type of integrated circuit operation mode may be so controlled using application of below board ground pin voltage, the disclosed systems and methods may be particularly advantageous for controlling the initiation of modes that are critical (e.g., irreversible or potentially damaging) since board ground is typically the lowest voltage present in a given system and voltages below board ground are therefore difficult to accidentally apply. Examples of types of integrated circuit modes that may be so controlled using below ground pin voltage include programming of one time programmable (OTP) circuits, reconfiguration of devices in the field, or any application where the integrated circuit needs to enter a different mode of operation and operation in this mode is critical to be done only when desired. For example, factory configuration of the device, special modes of operation for testing, debug or data collection, loading software upgrades, etc.

In one exemplary embodiment, the disclosed systems and methods may be implemented to prevent accidental programming of an NVM device of the type that may be contained in a general purpose integrated circuit that is destined for installation in an end use electronic component (e.g., such as television tuner, cell phone, computer, portable media player, GPS device, etc.) or a subassembly thereof. In such an embodiment, inadvertent programming of an NVM device may be prevented (e.g., during production testing or after installation into an end use component) by requiring application of a below ground pin voltage to at least one pin of the general purpose integrated circuit as at least one condition for allowing programming of the NVM device to proceed. This functionality may be implemented, for example, using operation control circuitry that is coupled to gate the voltage to a programming voltage input of the NVM device based on the sensed presence or absence of a below ground voltage applied to a pin of the general purpose circuitry, and in doing so prevent accidental or inadvertent programming due to conditions such as hot insertion of an integrated circuit part or power up without a valid reset of the part.

Such operation control circuitry may be configured to gate NVM programming voltage Vpp by controlling a programming switch so as to only allow programming voltage to be applied to a programming input of the NVM device upon detection of an applied voltage having a value that is pulled below ground. The operation control circuitry may additionally and optionally sense the value of normal power supply voltage Vdd and/or of an applied NVM programming voltage Vpp, and disable NVM programming operations if either of the sensed voltages falls outside of a pre-defined voltage range (e.g., in case of power supply brownout or other problem).

In one respect, disclosed herein is integrated circuitry, comprising: operation control circuitry configured to provide an operation control signal to initiate an operation mode; and a first external pin coupled to the operation control circuitry and configured to receive an externally applied voltage; wherein the operation control circuitry is configured to provide the operation control signal upon application of a below ground voltage to the first external pin.

In another respect, disclosed herein is a method of controlling an operation mode of an integrated circuit, comprising: sensing for the presence of an externally applied below ground voltage on a first external pin of the integrated circuit; and providing an operation control signal to initiate an operation mode of the integrated circuit upon application of a below ground voltage on the first external pin of the integrated circuit.

BRIEF DESCRIPTION OF THE DRAWINGS

FIG. 4 shows pin-below-ground sense circuitry according to one exemplary embodiment of the disclosed systems and methods.

FIG. 5 shows programming voltage sense circuitry according to one exemplary embodiment of the disclosed systems and methods.

FIG. 6 shows power supply voltage sense circuitry according to one exemplary embodiment of the disclosed systems and methods.

DESCRIPTION OF ILLUSTRATIVE EMBODIMENTS

Figure 1:
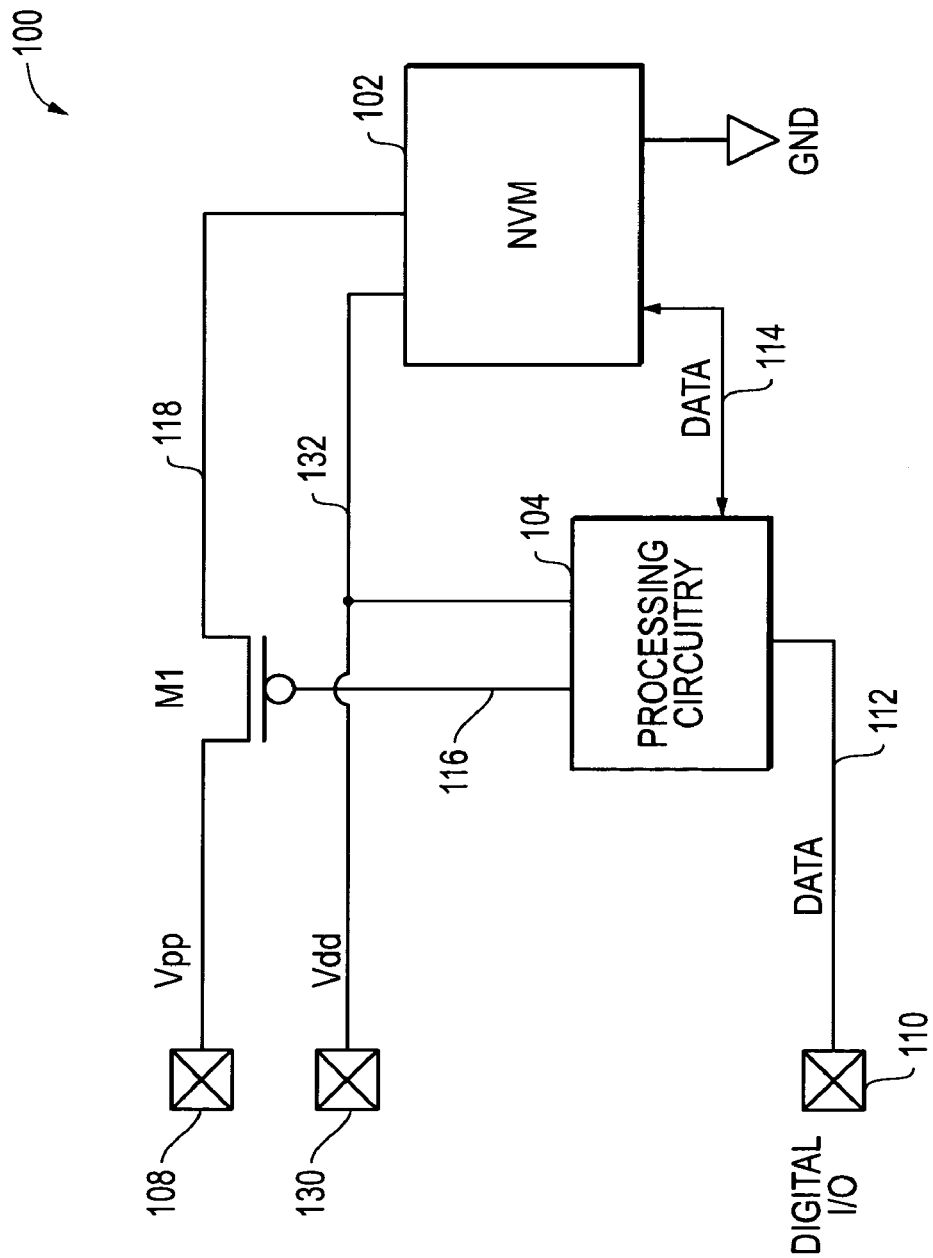
FIG. 1 is a simplified block diagram of prior art programmable NVM circuitry.
Figure 2A:
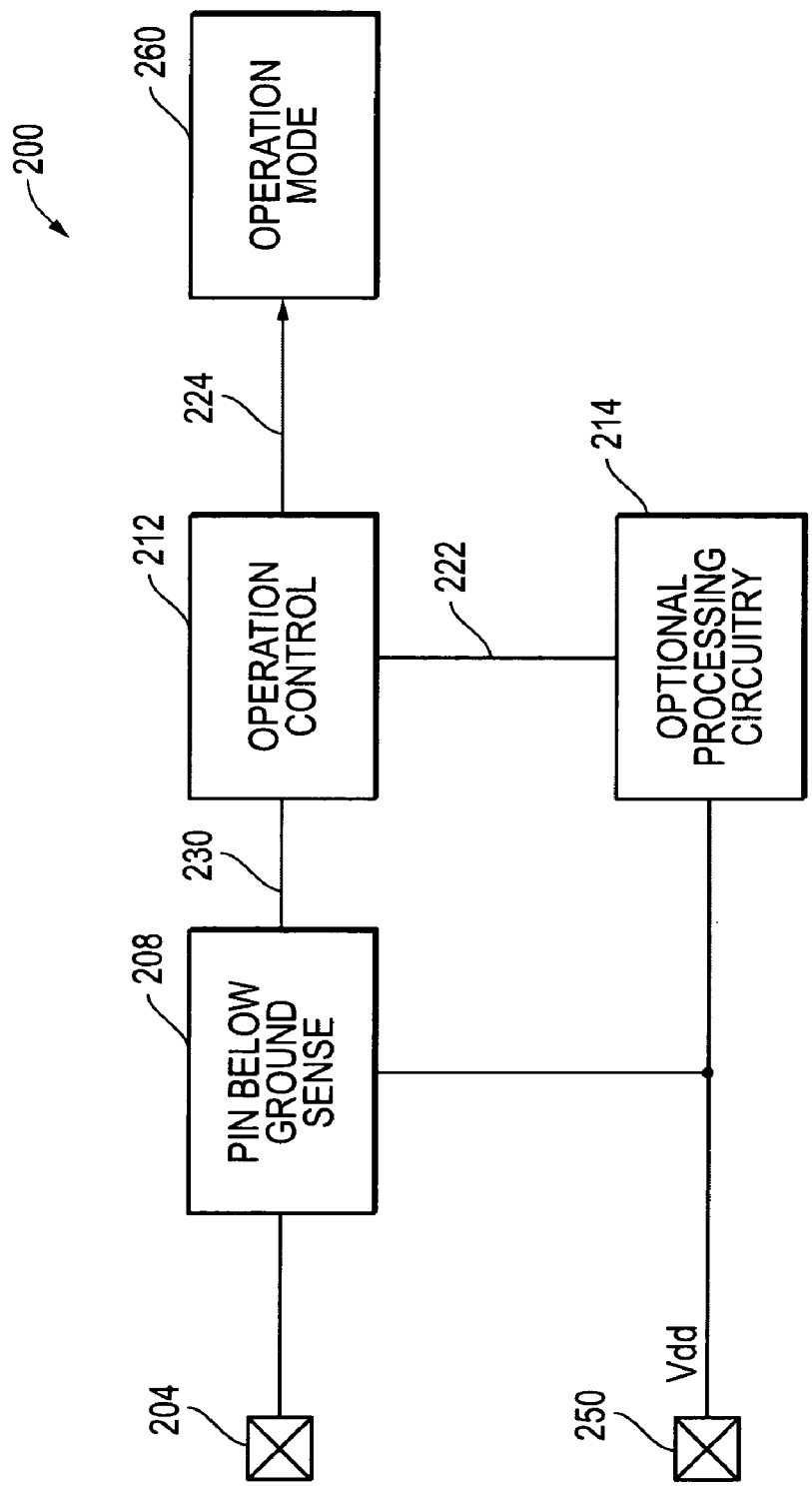
FIG. 2A is a simplified block diagram of integrated circuitry according to one exemplary embodiment of the disclosed systems and methods.

FIG. 2A illustrates integrated circuitry 200 as it may be implemented according to one exemplary embodiment to generate an operation control signal 224 that selectively initiates a mode of operation 260 of the integrated circuit 200. Integrated circuit 200 may be a part of any type of digital or analog integrated circuit adapted for performing one or more circuit operations, e.g., receiver circuitry, analog signal processing circuit, comparator, amplifier, etc. Examples of circuit operation modes 260 that may be so selectively enabled include, but are not limited to, memory programming (e.g., to gate memory operation to prevent inadvertent programming with faulty data), headphone audio input (e.g., to gate headphone audio input to prevent audible pop when circuitry is turned on), reconfiguration of a device for production test, or to enable factory-only modes for system debug or analysis, etc.

As shown in FIG. 2A, integrated circuitry 200 includes optional processing circuitry 214 (e.g., controller, microcontroller, processor, microprocessor, CPU, state machine, etc.) coupled to enable an operation mode by supplying an operation enable signal 222 (e.g., software enable signal or hardware enable signal) to operation control circuitry 212. Operation control circuitry 212 is configured to respond to operation enable signal 222 received from processing circuitry 214 by only providing operation control signal 224 in the presence of an applied below circuit ground pin voltage. For example, in the illustrated embodiment, operation control circuitry 212 is configured to monitor for a voltage present on pin 204 that meets a pre-defined voltage threshold below circuit ground using pin-below-ground sense circuitry 208. As shown, pin-below-ground sense circuitry 208 provides a pin_below_ground signal 230 to operation control circuitry 212 that is indicative of the presence of an applied voltage on pin 204 that meets the pre-defined below ground threshold. Power supply voltage (Vdd) to circuitry 200 may be provided as shown via a separate external pin 250.

It will be understood that the respective functionalities of pin-below-ground sense circuitry 208, operation control circuitry 212, and/or processing circuitry 214 do not have to be preformed by separate circuit components as illustrated, and may alternatively be consolidated or separated into any number of one or more components. Moreover, it is also possible that integrated circuitry 200 may only be provided with operation control circuitry 212 and without optional processing circuitry 214, e.g., such that operation control circuitry 212 selectively initiates an operation mode by providing an operation control signal 224 upon application of a below ground voltage to an external pin (e.g., such as pin 204), i.e., without the requirement of an operation enable signal 222 from processing circuitry 214. An analog integrated circuit 200 would be one example where optional processing circuitry 214 would be absent.

Figure 2B:
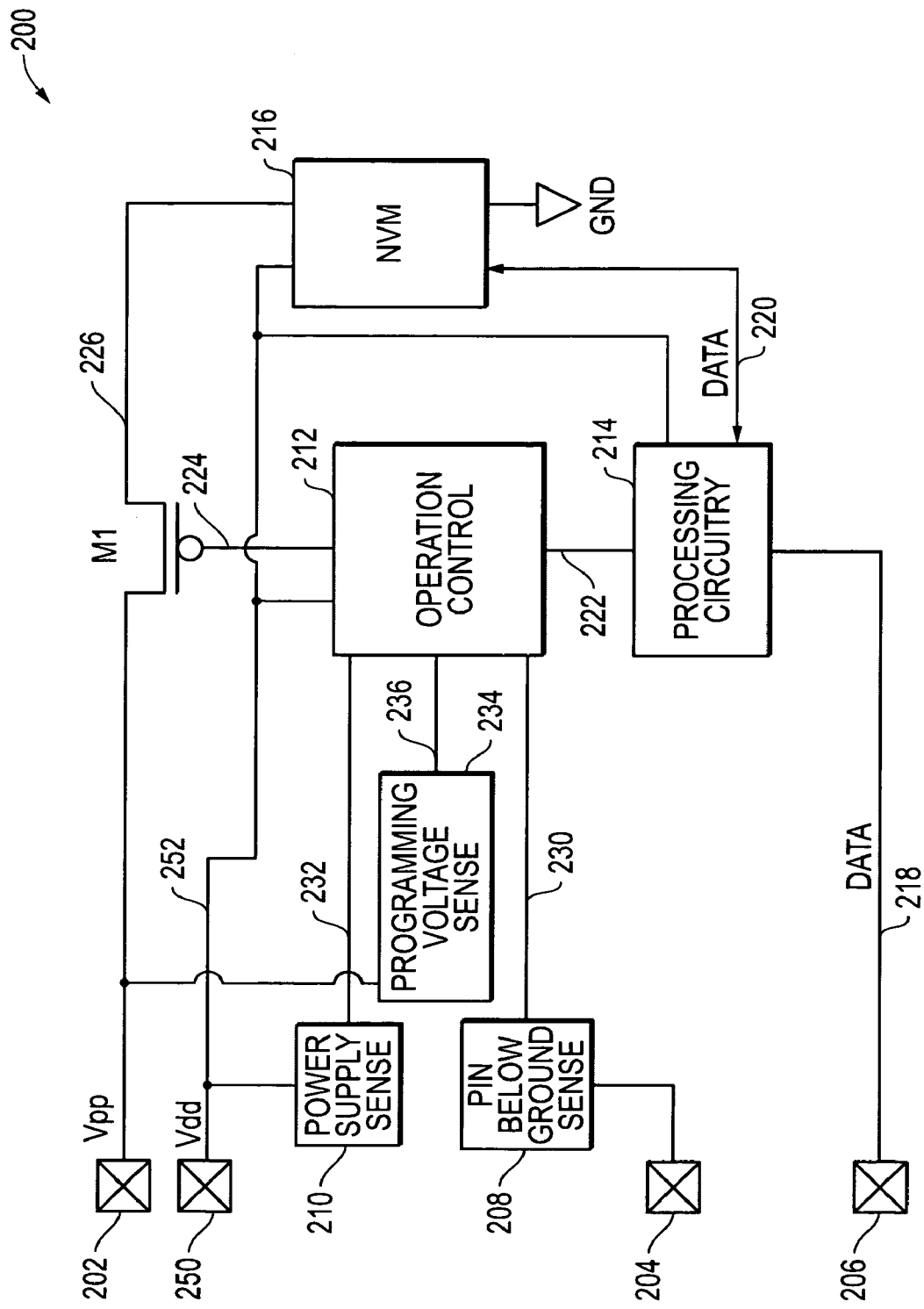
FIG. 2B is a simplified block diagram of integrated circuitry according to one exemplary embodiment of the disclosed systems and methods.

FIG. 2B illustrates integrated circuitry 200 as it may be configured in one exemplary embodiment as programmable NVM circuitry for performing the operational mode of programming a NVM device 216, such as the type that may be employed in a general purpose integrated circuit that may itself be incorporated into an end use electronic component such as television tuner, cell phone, personal computer, portable media players, etc. As shown in FIG. 2B, programmable NVM circuitry 200 includes a NVM device 216 with a programming input coupled to receive programming voltage Vpp (e.g. 5 volts or other suitable value that may be greater than the normal power supply voltage Vdd) from external pin 202 via conductive path 226 and programming switch M1, which may be a P-FET as shown or any other suitable type of switching device (e.g., N-FET, etc.) that operates to gate or selectively allow voltage from pin 202 to NVM device 216. A power supply pin 250 is present to provide power supply voltage Vdd (e.g., 3.3 volts) via conductive path 252 to a power input of the NVM device 216 and optionally other circuitry components of a general purpose integrated circuit. NVM device 216 may be a one time programmable (OTP) memory device or may be another type of non-volatile memory, e.g., such as fuses, etc. In one embodiment, NVM programming operations may be implemented, for example, prior to assembly of circuitry 200 with other components of end use electronic component. However, NVM programming operations may also be implemented at any other time, e.g., after assembly of circuitry 200 into an end use component.

As shown in FIG. 2B, a processing circuitry 214 is also coupled as shown to exchange data with NVM device 216 and with external digital I/O pin 206. Processing circuitry 214 may be a controller, microcontroller, processor, microprocessor, CPU, or any other type of processing circuitry suitable for performing the tasks described herein. In this configuration, processing circuitry 214 is coupled to receive NVM programming data 218 via digital I/O pin 206 and to provide NVM programming data 220 to NVM device 216. NVM programming data 220 may include data (e.g., a program of instructions and/or operating parameters) for implementing specific end use application/s for a general purpose circuit of which NVM programming circuitry 200 may form a part. Processing circuitry 214 is also coupled to enable NVM programming by supplying a operation enable signal 222 to operation control circuitry 212 which is configured to respond under certain conditions by providing a operation control signal 224 to close the normally open NVM programming switch M1 so that a programming voltage Vpp from power supply pin 202 is applied to NVM device 216 by conductive path 226 simultaneously with the NVM programming data 220 to allow NVM programming data 220 to be written into NVM device 216.

Still referring to FIG. 2B, operation control circuitry 212 may be configured to respond to a operation enable signal 222 received from processing circuitry 214 by only allowing programming of NVM device 216 in the presence of an applied below ground pin voltage and optionally on the occurrence of one or more other conditions. For example, in the illustrated embodiment, operation control circuitry 212 is configured to monitor for a voltage present on pin 204 that meets a pre-defined voltage threshold below circuit ground, (e.g., below −0.5 volts relative to circuit ground in the illustrated embodiment) using pin-below-ground sense circuitry 208. As shown, pin-below-ground sense circuitry 208 provides a pin_below-_ground signal 230 to operation control circuitry 212 that is indicative of the presence of an applied voltage on pin 204 that meets the pre-defined below ground threshold.

Operation control circuitry 212 may also be configured as shown to optionally monitor for the presence of Vdd and/or Vpp voltages on their respective pins 250 and 202 as additional preconditions for closing programming switch M1 to allow NVM programming operations to proceed. For example, as shown in FIG. 2B, operation control circuitry 212 may be coupled to optional power supply sense circuitry 210 that is configured to monitor voltage on pin 250 and to provide a Vdd_is_up signal 232 to operation control circuitry 212 when Vdd is "up." Similarly, operation control circuitry 212 may also be coupled to optional programming voltage sense circuitry 234 that is configured to monitor voltage on pin 202 and to provide a Vpp_is_up signal 236 to operation control circuitry 212 when Vpp is "up." A software_en signal 222 is also received by programming control 212 indicating that processing circuitry 214 is calling for programming of NVM device 216. It will be understood that the respective functionalities of pin-below-ground sense circuitry 208, power supply sense circuitry 210, programming voltage sense circuitry 234, operation control circuitry 212, and/or processing circuitry 214 do not have to be preformed by separate circuit components as illustrated, and may alternatively be consolidated or separated into any number of one or more components.

Figure 3:
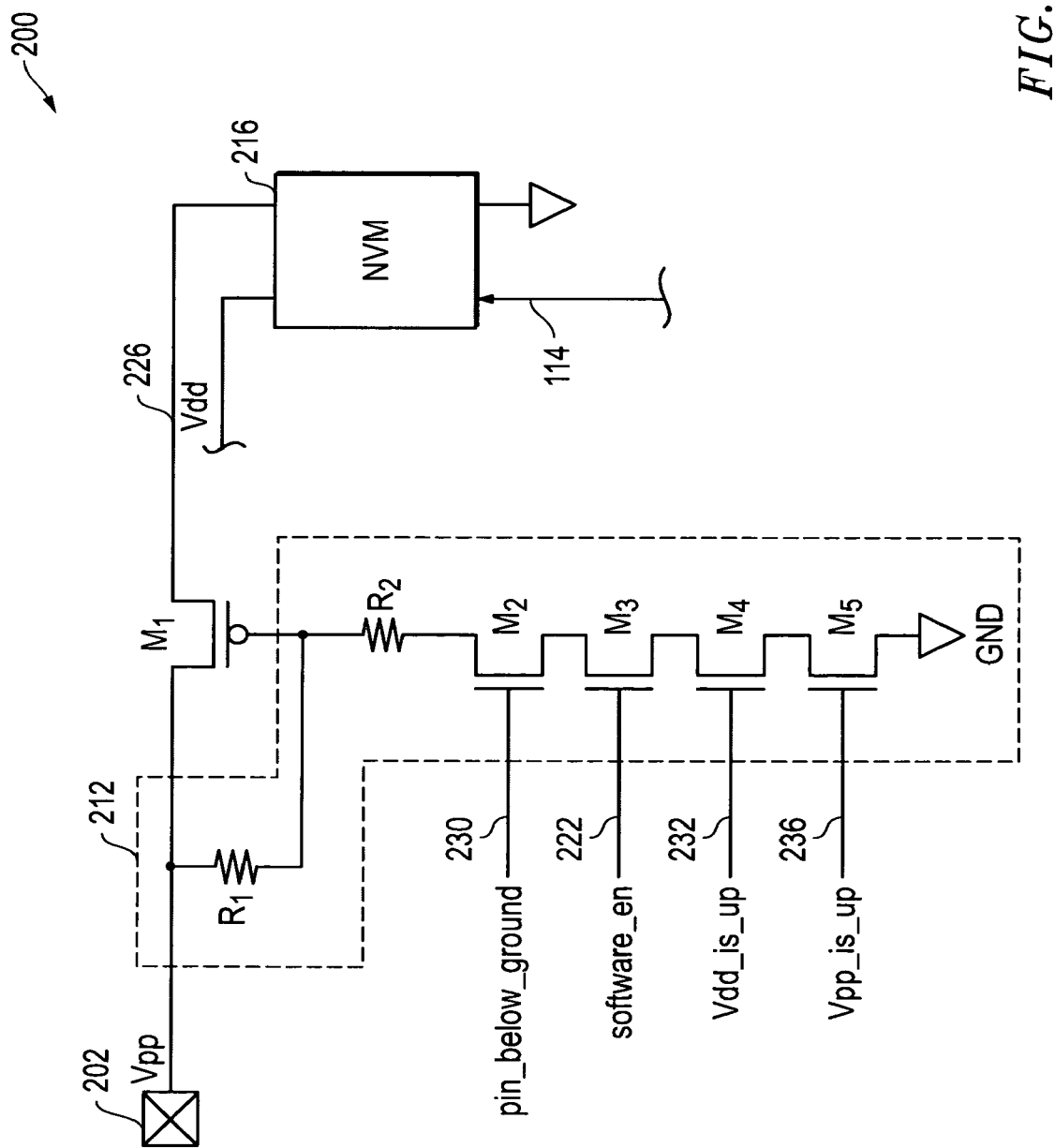
FIG. 3 shows operation control circuitry according to one exemplary embodiment of the disclosed systems and methods.

FIG. 3 illustrates a relevant portion of programmable NVM circuitry 200 and shows circuit detail of operation control circuitry 212 as it may be configured according to one exemplary embodiment of the disclosed systems and methods. As shown in FIG. 3, operation control circuitry 212 includes N-FET transistors M2, M3, M4 and M5 coupled in series between the gate of P-FET transistor programming switch M1 and ground. Each of transistors M2, M3, M4 and M5 is coupled as shown to receive a respective one of the pin_below_ground 230, software_en 222, Vdd33_is_up 232, or Vpp_is_up 236 signals which acts to turn on the respective coupled N-FET transistor. In this configuration, all four transistors M2, M3, M4 and M5 must conduct to pull down the voltage on the gate of M1 so that it turns on to conduct the programming voltage Vpp to NVM programming device 216 so that NVM programming can proceed. As further shown, a resistor R2 is coupled between the gate of switch M1 and transistor M2 and a resistor R1 is coupled at a node between R2 and pin 202. Relative resistive values of R1 and R2 may be selected such that when M2-M5 conduct, the gate voltage on M1 is sufficiently low so as to enable connectivity between pin 202 and conductive path 226. Further, the absolute values of R1 and R2 may be chosen such that the current drawn from Vpp through M2-M5 is acceptably small, e.g., in one exemplary embodiment R1=R2=100 KΩ.

It will be understood that operation control circuitry 212 may be configured in any other digital and/or analog manner suitable for performing the operation mode tasks described herein. For example, operation control circuitry 212 may be implemented as processing circuitry (e.g., controller, microcontroller, processor, microprocessor, CPU, state machine, etc.) that is coupled to receive pin_below_ground signal 230, and optionally other signals (e.g., Vdd_is_up signal 232, Vpp_is_up signal 236, etc.), and that is coupled to respond to signal 230 (and optional other signals) by controlling programming switch M1 with an operation control signal 224 in the manner and under the conditions previously described. In another example, operation control circuitry 212 may be coupled to control programming switch M1 based on signals received from analog-to-digital conversion (ADC) circuitry that provides appropriate input signal/s to operation control circuitry 212 upon application of below ground voltage to external pin 204, and optionally other conditions (e.g., Vdd is up, Vpp is up, etc.).

FIG. 4 illustrates pin-below-ground sense circuitry 208 as it may be configured according to one exemplary embodiment of the disclosed systems and methods. As shown, pin-below-ground sense circuitry 208 includes a N-FET transistor M2 that is coupled to external pin 204 to which a below ground voltage (e.g., of about −0.5 volts) is applied when programming of NVM device 216 is desired. A resistor $R_3$ is coupled between node 304 and ground, and resistor/s $9R_3$ are coupled between Vdd supply voltage (e.g., 3.3 volts) and node 304. Node 304 is coupled as shown to the gate of transistor M2, and resistors $9R_3$ and $R_3$ form a resistor divider, $R_3/(R_3+9R_3)=0.1$, such that voltage across transistor M2 (e.g., 0.83 volts in this example) will exceed the M2 threshold voltage $V_{TN}$ and be sufficient to cause transistor M2 to conduct when the voltage at external pin 204 is about 0.5 volts below ground. In this exemplary embodiment, the below ground voltage applied to pin 204 may be optionally set to about −0.5 volts in order to prevent any electrostatic discharge ("ESD") protection diodes in the general purpose circuitry from turning on during NVM programming operation mode, while at the same time being distinguishable from noise. However, greater or lesser below ground voltages may be employed in other embodiments. It will be understood that the value of $9R_3$ in FIG. 4 is exemplary only and that other values beside "9" may be selected or adjusted so that the below ground threshold may be chosen to fit a given application, i.e., this value is at the discretion of the implementer.

Still referring to FIG. 4, pin-below-ground sense circuitry 208 further includes resistor $R_4$ coupled between power supply voltage Vdd and transistor M2, and a node 306 is provided at which point inverter 302 is coupled between resistor $R_4$ and transistor M2. When a below ground voltage applied to pin 204, the gate of transistor M2 conducts and node 306 is then pulled down low by virtue of presence of resistor $R_4$. Inverter 302 goes high when it senses the resulting low voltage at node 306, and provides a positive voltage pin_below_ground signal 230 to operation control circuitry 212 as shown. It will be understood that the particular configuration of pin-below-ground sense circuitry 208 that is illustrated in FIG. 4 is exemplary only, and that any other configuration of circuitry components may be employed that is suitable for sensing application of a below ground voltage at external pin 204 and generating a pin_below_ground signal 230 in response thereto.

FIG. 5 illustrates programming voltage sense circuitry 234 as it may be configured according to one exemplary embodiment of the disclosed systems and methods. As shown, programming voltage sense circuitry 234 includes two equal value resistors $R_5$ coupled between external pin 202 and ground, with a node 402 coupled between the two resistors. Upon application of a programming voltage of 5 volts to external pin 202, node 402 is driven to 2.5 volts to provide a Vpp_is_up signal 236 to operation control circuitry 212 as shown. It will be understood that the particular configuration of programming voltage sense circuitry 234 that is illustrated in FIG. 5 is exemplary only, and that any other configuration of circuitry components may be employed that is suitable for sensing that programming voltage is up at external pin 204 and generating a Vpp_is_up signal 236 in response thereto. For example, another exemplary embodiment may employ a resistor divider between pin 202 and ground, and compares this resistor divided version of pin 202 to a bandgap reference voltage.

FIG. 6 illustrates power supply sense circuitry 210 as it may be configured according to one exemplary embodiment of the disclosed systems and methods. As shown, power supply sense circuitry 210 includes a P-FET transistor M3 that is coupled to external power supply pin 250 at which Vdd supply voltage (e.g., 3.3 volts) is present when NVM circuitry 200 is powered up. A resistor $R_7$ is coupled as shown between transistor M3 and ground, and a node 504 is present between transistor M3 and resistor $R_7$. As further shown, resistor/s $2R_6$ is coupled between a node 502 and ground, and a resistor $R_6$ is coupled between power supply pin 250 and node 502. Node 502 is coupled as shown to the gate of transistor M3, and resistors $2R_6$ and $R_6$ form a resistor divider, $2R_6/(R_6+2R_6)$ =0.67, such that voltage at node 502 will be ⅔ of Vdd applied to pin 250 and the voltage across transistor M3 will be −⅓ of Vdd (or 2.2 volts−3.3 volts=−1.1 volts in this example), thus exceeding the M2 threshold voltage $V_{TP}$ and causing transistor M3 to conduct when the Vdd voltage at external pin 250 is greater than $(3 \times |V_{TP}|)$. This in turn drives voltage at node 504 and input of buffer circuit 506 to Vdd (or 3.3 volts in this example) to provide a Vdd_is_up signal 232=1 from output of buffer circuit 506 to operation control circuitry 212 as shown. It will be understood that the particular configuration of power supply sense circuitry 210 that is illustrated in FIG. 6 is exemplary only, and that any other configuration of circuitry components may be employed that is suitable for sensing that power supply voltage is up at external pin 250 and generating a Vdd_is_up signal 232 in response thereto. For example, another exemplary embodiment may employ a resistor divider between pin 250 and ground, and compares this resistor divided version of pin 250 to a bandgap reference voltage.

Figure 7:
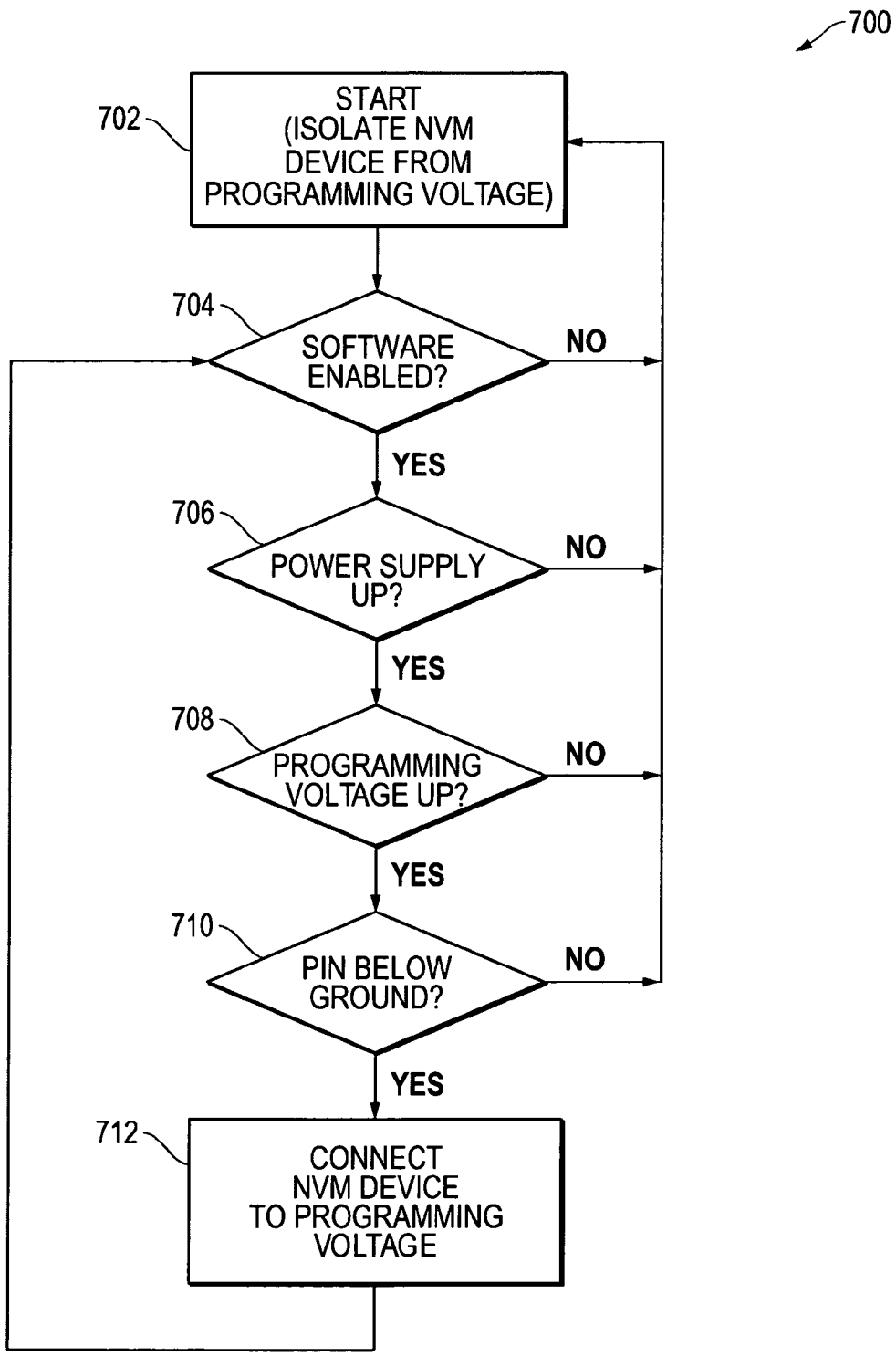
FIG. 7 is a flow chart showing methodology according to one exemplary embodiment of the disclosed systems and methods.

FIG. 7 is a flow chart showing methodology 700 which may be implemented by operation control circuitry 212 to allow or disallow programming of NVM device 216 based on the combination of sensed parameters described in relation to the exemplary embodiment of FIG. 2B. As shown, methodology 700 starts in step 702 where NVM device 216 is isolated from a programming voltage input (external pin 202) of NVM circuitry 200 as long as any of the parameters in steps 704, 706, 708 and 710 remains in a negative state. However, if a software enable signal is received in step 704 from processing circuitry 214, then methodology 700 proceeds to steps 706, 708 and 710. If in these respective steps signals are received representing Vdd power supply up, Vpp programming voltage up, and pin below ground states, then NVM device 216 is connected (e.g., by switch M1) to programming voltage input of NVM circuitry 216 to implement a programming mode of NVM device 216. As shown, NVM device 216 remains so connected as long as each of steps 704, 706, 708 and 710 remain in an affirmative state. However, if any of steps 704, 706, 708 and 710 returns to a negative state, then NVM device 216 is again isolated from programming voltage input of NVM circuitry 216.

It will be understood that methodology 700 is exemplary only, and that any other alternative sequence of steps 704, 706, 708 and 710 may be implemented, and/or that additional or fewer steps may be employed. Furthermore, the disclosed systems and methods may be implemented in one embodiment using only application of below ground voltage (e.g., step 710) as a parameter to control operation of an integrated circuit.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. Integrated circuitry, comprising:
   operation control circuitry configured to provide an operation control signal to initiate an operation mode; and
   a first external pin coupled to the operation control circuitry and configured to receive an externally applied voltage; and
   voltage sensing circuitry configured to detect the presence of an externally applied voltage received at the first external pin that is below circuit ground;
   wherein the operation control circuitry is configured to provide the operation control signal only upon detection by the voltage sensing circuitry of the application of the below ground voltage to the first external pin.

2. Integrated circuitry, comprising:
   operation control circuitry configured to provide an operation control signal to initiate an operation mode; and
   a first external pin coupled to the operation control circuitry and configured to receive an externally applied voltage;
   wherein the operation control circuitry is configured to provide the operation control signal upon application of a below ground voltage to the first external pin; and
   further comprising voltage sensing circuitry coupled between the first external pin and the operation control circuitry, the voltage sensing circuitry being configured to sense the presence of a voltage present on the first external pin that meets a pre-defined voltage threshold that is below circuit ground; and to provide a signal to the operation control circuitry that is indicative of the presence of the applied voltage on the first external pin that meets the pre-defined below ground threshold.

3. Integrated circuitry, comprising:
operation control circuitry configured to provide an operation control signal to initiate an operation mode; and
a first external pin coupled to the operation control circuitry and configured to receive an externally applied voltage;
wherein the operation control circuitry is configured to provide the operation control signal upon application of a below ground voltage to the first external pin; and
where the circuitry further comprises:
  processing circuitry configured to enable the operation mode by providing an operation enable signal to the operation control circuitry, and
  wherein the operation control circuitry is configured to provide the operation control signal only when the operation enable signal is provided to the operation control circuitry by the at least one processing circuitry at the same time as application of a below ground voltage to the first external pin.

4. The circuitry of claim 3, further comprising a nonvolatile memory (NVM) device coupled to receive programming data from the processing circuitry and being coupled to receive the operation control signal from the operation control circuitry; wherein the operation mode comprises programming of the NVM device; and wherein the processing circuitry is configured to provide the operation enable signal to the operation control circuitry at the same time the programming data is provided to the NVM device.

5. The circuitry of claim 4, further comprising:
a second external pin coupled to the operation control circuitry and to the NVM device, the second external pin being configured to receive an externally applied programming voltage for programming the NVM device, and the programming voltage being greater than a power supply voltage provided to the integrated circuitry;
wherein the operation control circuitry is configured to provide the operation control signal only when the operation enable signal is provided to the operation control circuitry by the at least one processing circuitry at the same time as application of a below ground voltage to the first external pin and application of the programming voltage to the second external pin.

6. The circuitry of claim 5, further comprising:
a switch device coupled between the second external pin and the NVM device, the switch device coupled to receive the operation control signal from the operation control circuitry and to selectively conduct the programming voltage to the NVM device in response to the operation control signal; and
programming voltage sensing circuitry coupled between the second external pin and the operation control circuitry, the programming voltage sensing circuitry being configured to sense the presence of the programming voltage on the first external pin; and to provide a signal to the operation control circuitry that is indicative of the presence of the programming voltage on the second external pin;
wherein the operation control circuitry is configured to provide the operation control signal only when the operation enable signal is provided to the operation control circuitry by the at least one processing circuitry at the same time as at least the following two signals are provided:
  a signal from the voltage sensing circuitry to the operation control circuitry that is indicative of the presence of the applied below ground voltage on the first external pin, and
  a signal from the programming voltage sensing circuitry to the operation control circuitry that is indicative of the presence of the programming voltage on the second external pin.

7. The circuitry of claim 5, further comprising:
a third external pin coupled to the operation control circuitry, the third external pin being configured to receive an externally applied power supply voltage provided to the integrated circuitry;
wherein the operation control circuitry is configured to provide the operation control signal only when the operation enable signal is provided to the operation control circuitry by the at least one processing circuitry at the same time as application of a below ground voltage to the first external pin, application of the programming voltage to the second external pin, and application of the power supply voltage to the third external pin.

8. The circuitry of claim 7, further comprising:
a switch device coupled between the second external pin and the NVM device, the switch device coupled to receive the operation control signal from the operation control circuitry and to selectively conduct the programming voltage to the NVM device in response to the operation control signal;
programming voltage sensing circuitry coupled between the second external pin and the operation control circuitry, the programming voltage sensing circuitry being configured to sense the presence of the programming voltage on the first external pin; and to provide a signal to the operation control circuitry that is indicative of the presence of the programming voltage on the second external pin; and
power supply voltage sensing circuitry between the third external pin and the operation control circuitry, the power supply voltage sensing circuitry being configured to sense the presence of the power supply voltage on the third external pin; and to provide a signal to the operation control circuitry that is indicative of the presence of the power supply voltage on the third external pin;
wherein the operation control circuitry is configured to provide the operation control signal only when the operation enable signal is provided to the operation control circuitry by the at least one processing circuitry at the same time as at least the following three signals are provided:
  a signal from the voltage sensing circuitry to the operation control circuitry that is indicative of the presence of the applied below ground voltage on the first external pin,
  a signal from the programming voltage sensing circuitry to the operation control circuitry that is indicative of the presence of the programming voltage on the second external pin, and
  a signal from the power supply voltage sensing circuitry to the operation control circuitry that is indicative of the presence of the power supply voltage on the third external pin.

9. The circuitry of claim 4, wherein the NVM device is a one time programmable (OTP) memory device.

10. The circuitry of claim 4, wherein the integrated circuitry comprises a portion of a general purpose circuit; and wherein the programming data comprises software and settings of a dedicated purpose for the general purpose circuit.

11. A method of controlling an operation mode of an integrated circuit, comprising:
sensing for the presence of an externally applied below ground voltage on a first external pin of the integrated circuit; and
initiating an operation mode of the integrated circuit only upon detection of the application of a below ground voltage on the first external pin of the integrated circuit.

12. A method of controlling an operation mode of an integrated circuit, comprising:
sensing for the presence of an externally applied below ground voltage on a first external pin of the integrated circuit; and
providing an operation control signal to initiate an operation mode of the integrated circuit upon application of a below ground voltage on the first external pin of the integrated circuit; and
where the method further comprises sensing for the presence of an externally applied below ground voltage on the first external pin of the integrated circuit that meets a pre-defined voltage threshold that is below circuit ground; and providing the operation control signal to initiate the operation mode in response to the receipt of the operation enable signal from the at least one processing circuitry only when the externally applied below ground voltage meeting the pre-defined voltage threshold is present at the first external pin of the integrated circuit at the same time that the operation enable signal is received.

13. A method of controlling an operation mode of an integrated circuit, comprising:
sensing for the presence of an externally applied below ground voltage on a first external pin of the integrated circuit; and
providing an operation control signal to initiate an operation mode of the integrated circuit upon application of a below ground voltage on the first external pin of the integrated circuit; and
where the method further comprises:
receiving an operation enable signal from at least one processing circuitry, the operation enable signal for enabling the operation mode of the integrated circuit, and
providing the operation control signal to initiate the operation mode in response to the receipt of the operation enable signal from the at least one processing circuitry only when the externally applied below ground voltage is present at the first external pin of the integrated circuit at the same time that the operation enable signal is received.

14. The method of claim 13, wherein the integrated circuit comprises a non-volatile memory (NVM) device configured to receive programming data; and wherein the method further comprises receiving the operation enable signal from the processing circuitry at the same time that programming data is provided to the NVM device.

15. The method of claim 14, further comprising:
sensing for the presence of an externally applied NVM programming voltage at a second external pin of the integrated circuit, the programming voltage being greater than a power supply voltage provided to the integrated circuit; and
providing the operation control signal only when the operation enable signal is received from the at least one processing circuitry simultaneously with presence of the below ground voltage at the first external pin and presence of the programming voltage at the second external pin.

16. The method of claim 15, further comprising:
providing a switch device coupled between the second external pin and the NVM device, the switch device coupled to receive the operation control signal and to selectively conduct the programming voltage to the NVM device in response to the operation control signal; and
sensing for the presence of the programming voltage on the second external pin; and
providing the operation control signal to cause the switch device to conduct the programming voltage to the NVM device only when the operation enable signal is received from the at least one processing circuitry simultaneously with presence of the below ground voltage on the first external pin, and presence of the programming voltage on the second external pin.

17. The method of claim 16, further comprising:
sensing for the presence of an externally applied power supply voltage at a third external pin of the integrated circuit; and
providing the operation control signal only when the operation enable signal is received from the at least one processing circuitry simultaneously with the presence of the applied below ground voltage on the first external pin, presence of the programming voltage on the second external pin, and presence of the power supply voltage on the third external pin.

18. The method of claim 17, further comprising:
providing a switch device coupled between the second external pin and the NVM device, the switch device coupled to receive the operation control signal and to selectively conduct the programming voltage to the NVM device in response to the operation control signal;
sensing for the presence of the programming voltage on the second external pin;
sensing for the presence of the power supply voltage on the third external pin; and
providing the operation control signal to cause the switch device to conduct the programming voltage to the NVM device only when the operation enable signal is received from the at least one processing circuitry simultaneously with the presence of the applied voltage on the first external pin, presence of the programming voltage on the second external pin, and presence of the power supply voltage on the third external pin.

19. The method of claim 14, wherein the NVM device is a one time programmable (OTP) memory device.

20. The method of claim 14, wherein the integrated circuit comprises a portion of a general purpose circuit; and wherein the programming data comprises software and settings of a dedicated purpose for the general purpose circuit.

* * * * *